(12) United States Patent
Lin et al.

(10) Patent No.: US 7,738,852 B2
(45) Date of Patent: Jun. 15, 2010

(54) LOW NOISE MIXER

(75) Inventors: Ying-Yao Lin, Hsin-Chu Hsien (TW); Ying-Hsi Lin, Hsin-Chu (TW)

(73) Assignee: Realtek Semiconductor Corp., HsinChu (TW)

( * ) Notice: Subject to any disclaimer, the term of this patent is extended or adjusted under 35 U.S.C. 154(b) by 696 days.

(21) Appl. No.: 11/567,222

(22) Filed: Dec. 6, 2006

(65) Prior Publication Data
US 2007/0142018 A1 Jun. 21, 2007

(30) Foreign Application Priority Data
Dec. 15, 2005 (TW) .............................. 94144519 A

(51) Int. Cl.
*H04B 1/26* (2006.01)
(52) U.S. Cl. .................. 455/326; 455/114.1; 455/152.1
(58) Field of Classification Search ... 455/114.1–114.3, 455/152.1, 152.3, 326, 334, 318–323
See application file for complete search history.

(56) References Cited

U.S. PATENT DOCUMENTS

| 3,241,078 | A  | 3/1966  | Jones |
| 5,675,392 | A  | 10/1997 | Nayebi |
| 5,901,350 | A  | 5/1999  | Stoichita |
| 6,255,889 | B1 | 7/2001  | Branson |
| 6,438,365 | B1 | 8/2002  | Balteanu |
| 6,850,753 | B2 | 2/2005  | Zhang et al. |
| 6,865,382 | B2 | 3/2005  | Behzad |
| 6,889,037 | B2 | 5/2005  | Darabl |
| 2006/0229046 | A1* | 10/2006 | Bult et al. ................ 455/252.1 |

FOREIGN PATENT DOCUMENTS

| TW | 330354 | 4/1998 |
| TW | 484257 | 4/2002 |
| TW | 589783 | 6/2004 |

OTHER PUBLICATIONS

Tang, "Design of S-GHz CMOS RF Receiver Front-End Circuits," Chapter 5, Doctorate Dissertation, Dept. of EECS, National Taiwan University, Taiwan, 2002. pp. 93-114.
Lee and Choi, "Current-Reuse Bleeding Mixer," Electronic Letters, Apr. 13, 2000, vol. 36, No. 8, IEE 2000, pp. 696-697.

(Continued)

Primary Examiner—Tony T Nguyen
(74) Attorney, Agent, or Firm—Winston Hsu

(57) ABSTRACT

Disclosed is a mixer comprising: a switching circuit, having a first pair of differential signal nodes and a second pair of differential signal nodes, for switching according to a local oscillation signal; an amplifying stage circuit, for receiving an input signal and amplifying the input signal; a load circuit, for serving as the loading of the mixer and generating an output signal of the mixer; a common-mode feedback circuit, for receiving the output signal and generating a feedback signal according to the output signal; a first current source, for receiving the feedback signal and generating a first current according to the feedback signal; and a second current source, for receiving the feedback signal and generating a second current according to the feedback signal.

19 Claims, 3 Drawing Sheets

OTHER PUBLICATIONS

"A 1.9GHz Wide-Band IF Double Conversion CMOS Integrated Receiver for Cordless Telephone Applications"(Rudell et al) 1997. Retrieved from the Internet on the Apr. 4, 2007 via: http://kabuki.eecs.berkeley.edu/%7Ejrudell/papers/isscc/.

Gilbert, Barrie: The Micromixer: A Highly Linear Variant of the Gilbert Mixer Using a Bisymmetric Class-AB Input Stage, In: Solid-State Circuits, IEEE Journal, vol. 32, No. 9, pp. 1412 to 1423, Sep. 1997.

* cited by examiner ly, to a low noise mixer.

LOW NOISE MIXER

BACKGROUND OF THE INVENTION

1. Field of the Invention

The present invention relates to a mixer, and more particularly, to a low noise mixer.

2. Description of the Prior Art

A mixer is an indispensable component for a wireless communication system. The mixer is mainly used for mixing a baseband signal and a local oscillator signal to generate an RF signal, or for mixing a RF signal and a local oscillator signal to generate a baseband signal. In U.S. Pat. No. 3,241,078, Gilbert discloses a conventional active mixer, now widely known as a Gilbert cell. Various improvements to the Gilbert cell are continuously proposed. The primary advantage of the Gilbert cell is the better signal gain at the output signal; however, the Gilbert cell has a serious problem with flicker noise. The flicker noise in a mixer or an oscillator may be transformed to phase noise thereby limiting the spectral purity.

One improvement to the Gilbert cell is a mixer with a common-mode feedback circuit, which is disclosed in U.S. Pat. No. 6,865,382. The common-mode feedback circuit can fix the DC voltage of the mixer output terminal at a predetermined working range. This kind of mixer can provide an adjustable gain. However, the common-mode circuit also generates flicker noise, such that the output signal of the mixer is disturbed. Another improvement to the Gilbert cell is a current-bleeding type mixer. The current-bleeding type mixer is disclosed in page 108, "5 GHz CMOS RF RECEIVER FRONT END CIRCUIT DESIGN" by Dr. Tang Gu Tsun, Department of Electrical Engineering, National Taiwan University, wherein the current-bleeding type mixer is used for decreasing the flicker noise come along with the Gilbert cell. Since the flicker noise is in proportion to the current passing through the switch circuit, the current-bleeding type mixer, therefore, provides an auxiliary current to decrease the current passing through the switch circuit, and as a result, alleviating the flicker noise. Additionally, different kinds of current-bleeding type mixers are further disclosed in U.S. Pat. No. 6,889,037, as well as in "Current-Reuse Bleeding Mixer," Electronics Letters, 13Apr. 2000, Vol. 36, No. 8, IEE 2000 by Lee and Choi. Also, a different kind of mixer structure is disclosed in U.S. Pat. No. 6,850,753.

SUMMARY OF THE INVENTION

Therefore, one objective of the present invention is to provide a mixer capable of decreasing the flicker noise phenomenon imposed upon the output signal.

Another objective of the present invention is to provide a mixer, which can stabilize the common-mode voltage at the mixer output terminal.

The embodiment of the present invention discloses a mixer, which comprises: a switching circuit, having a first pair of differential signal nodes and a second pair of differential signal nodes, for switching according to a local oscillation signal; an amplifying stage circuit, coupled to the first pair of differential signal nodes, for receiving an input signal and amplifying the input signal; a load circuit, coupled to the second pair of differential signal nodes, for serving as the loading of the mixer and generating an output signal of the mixer; a common-mode feedback circuit, for receiving the output signal and generating a feedback signal according to the output signal; a first current source, coupled to a first node of the first pair of differential signal nodes, for receiving the feedback signal and generating a first current according to the feedback signal; and a second current source, coupled to a second node of the first pair of differential signal nodes, for receiving the feedback signal and generating a second current according to the feedback signal.

Another embodiment of the present invention discloses a mixer, which comprises: a switching circuit, having a first pair of differential signal nodes and a second pair of differential signal nodes, for switching according to a local oscillation signal; an amplifying stage circuit, coupled to the first pair of differential signal nodes, for receiving an input signal and amplifying the input signal; a load circuit, coupled to the second pair of differential signal nodes, for serving as the loading of the mixer and generating an output signal of the mixer; and a common-mode feedback path, for receiving the output signal, generating a feedback signal according to the output signal, and adjusting an amount of current passing through the switching circuit according to the feedback signal.

Another embodiment of the present invention discloses a mixer, which comprises: a switching circuit, having a first pair of differential signal nodes and a second pair of differential signal nodes, for switching according to a local oscillation signal; an amplifying stage circuit, coupled to the first pair of differential signal nodes for receiving an input signal and amplifying the input signal; a load circuit, coupled to the second pair of differential signal nodes, for serving as the loading of the mixer and generating an output signal of the mixer; and a common-mode feedback path, coupled to the second pair of differential signal nodes for receiving the output signal from the second pair of differential signal nodes, and coupled to the first pair of differential signal nodes for adjusting a DC bias state of the first pair of differential signal nodes.

Another embodiment of the present invention discloses a frequency-mixing method, which comprises: receiving an input signal; amplifying the input signal; mixing a local oscillation signal and an amplified input signal using a switching circuit, to generate an output signal; and performing, according to the output signal, a common-mode feedback operation upon the amplified, but not yet being mixed with the local oscillation signal by the switching circuit, input signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean, "include, but not limited to . . . . " Also, the term "couple" is intended to mean either an indirect or direct electrical connection. Accordingly, if one device is coupled to another device, that connection may be through a direct electrical connection, or through an indirect electrical connection via other devices and connections.

Figure 1:
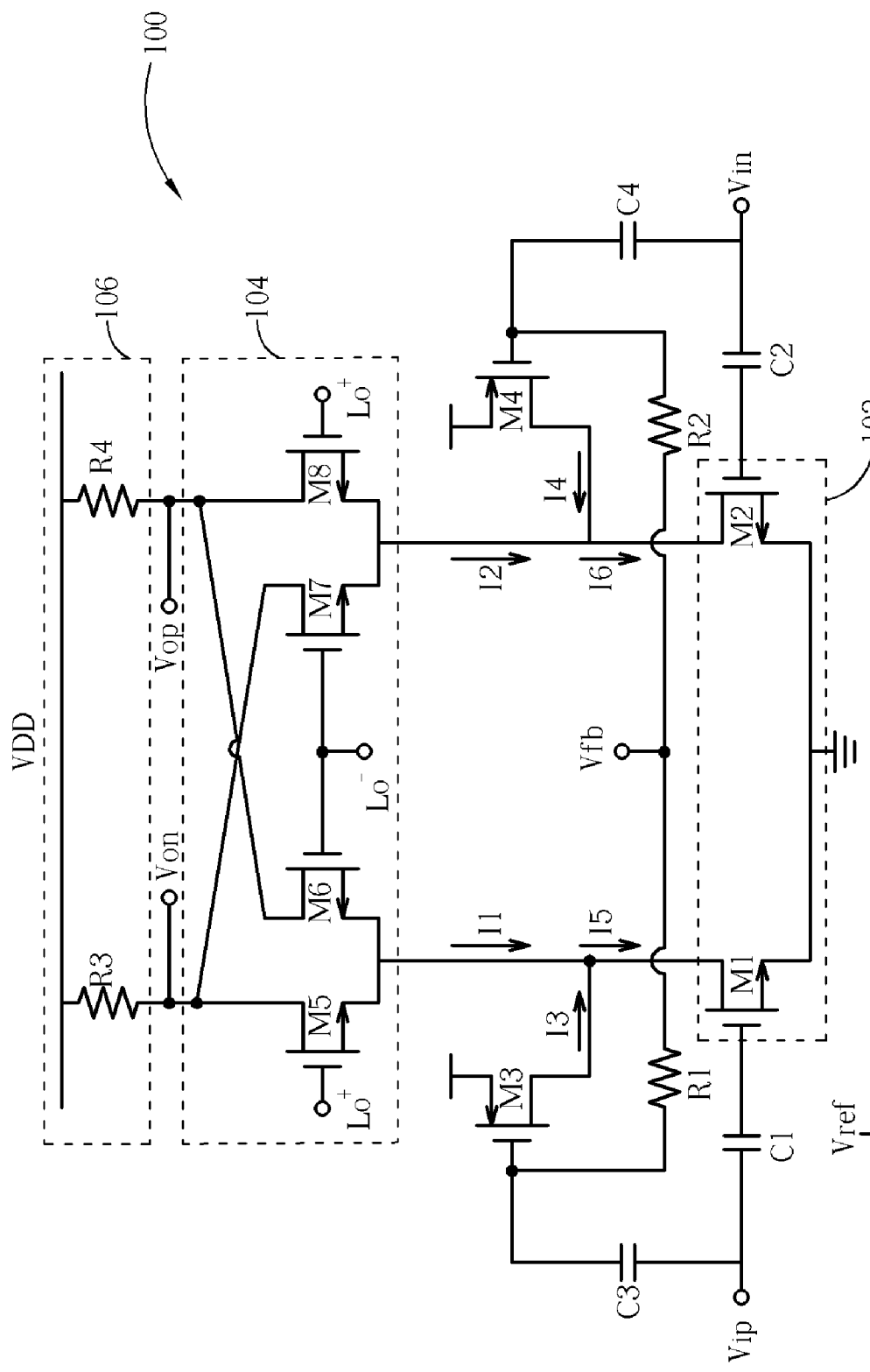
FIG. 1 is a schematic diagram illustrating a low noise mixer according to one embodiment of the present invention.

Please refer to FIG. 1. FIG. 1 is a schematic diagram illustrating a low noise mixer 100 according to one embodiment of the present invention. As shown in FIG. 1, the low noise mixer 100 has a differential structure including an amplifying stage circuit 102, a switching circuit 104, and a load circuit 106. In this embodiment, the amplifying stage circuit 102 is comprised of NMOS transistors $M_1$ and $M_2$, to provide the signal amplifying capability of the mixer 100 (represented by the transconductance gmn of M1, M2). The switching circuit 104 is coupled to the amplifying stage circuit 102 and includes NMOS transistors M5, M6, M7, and M8 in this embodiment. The load circuit 106, in this embodiment, is coupled to the switching circuit 104 and includes resistors R3 and R4. The switching circuit 104 is controlled by the periodic local oscillation signal (LO+, LO−) to determine the connection between the amplifying stage circuit 102 and the load circuit 106; this way the input signal (Vip, Vin) inputted to the amplifying stage through the capacitance C1, C2 is converted into the output signal ($V_{op}$, $V_{on}$) at a different frequency band. After understanding the disclosure and the teaching of the present embodiment and accompanying drawing, those who are familiar with the Gilbert cell can easily understand the function and the operation of the amplifying stage circuit 102, the switching circuit 104, and the load circuit 106, and therefore further description is herein omitted for the sake of brevity.

It should be noted that, although in the above-mentioned embodiment NMOS transistors are used to implement the amplifying stage circuit 102, the use of NMOS transistors is not meant to limit the scope of the present invention. A person skilled in the art can easily adopt other active devices such as MOS transistors or BJT transistors in the place of the NMOS transistors. Also, although in the above-mentioned embodiment NMOS transistors are used to implement the switching circuit 104, the use of NMOS transistors is not meant to limit the scope of the present invention. A person skilled in the art can utilize other well-known switch configurations instead. Additionally, although in the above-mentioned embodiment resistors are used to implement the load circuit 106, the use of resistors is not meant to limit the scope of the present invention. A person skilled in the art can easily adopt other load devices composed of passive devices and/or active devices in the place of the resistors. The above-mentioned alternative designs all fall within the scope of the present invention.

As is well known to those having average skill in the art of mixer design, the mixer 100 according to the above-mentioned embodiment can be applied to down-conversion as well as up-conversion. In the case of down-conversion, the input signal (Vip, Vin) can be the RF signal received by an antenna, and the output signal (Vop, Von) resulted from the mixing of local signal LO and input signal (Vip, Vin) becomes an intermediate frequency signal IF. On the other hand, in the case of up-conversion, the input signal (Vip, Vin) can be a processed intermediate frequency signal IF, and the output signal (Vop, Von) resulted from the mixing of local signal LO and input signals (Vip, Vin) becomes the RF signal to be ouputted.

In this embodiment, the mixer 100 further includes PMOS transistors M3, M4 functioning as two current sources, wherein the PMOS transistors M3, M4 are respectively coupled to the power supply voltage VDD and the drains of the NMOS transistors M1 and M2, and respectively receive the differential components of the input signal Vip, Vin at the gates via the capacitances C3, C4. According to said structure, two goals can be achieved. From the prospective of DC biasing, the currents I3, I4 passing through the transistors M3, M4 can reduce the currents passing through the switching circuit 104, which in effect constitutes current bleeding. As a result, the flicker noise contributed by the switching circuit 104 can be significantly reduced. From the perspective of AC small signal analyzing, besides of amplifying the input signal (Vip, Vin) with the transistors M1, M2, the transistors M3, M4 also contribute to the amplifying effect. In other words, the equivalent transconductance of the amplifying stage of the mixer 100 becomes the sum of M1/M2 transconductance gmn and M3/M4 transconductance gmp, resulting in an improvement to the gain of the mixer 100 imposed upon the input signal.

It is well known to those of ordinary skill in the electronic circuit design art that the capacitances C1, C2, C3, and C4 are used for preventing the DC component of the differential input voltage (Vip, Vin) from entering the mixer 100, i.e., serves the purpose of AC coupling.

In addition to the above-mentioned components, the mixer 100 further includes a common-mode feedback path for stabling the common-mode voltage level (or DC bias) of the output terminal of the mixer 100. In this embodiment, the common-mode feedback path includes a common-mode feedback circuit 108, resistors R1, R2, and the above-mentioned PMOS transistors M3, M4. The common-mode feedback circuit 108 receives the output signal (Vop, Von) and a reference voltage Vref, to output a feedback voltage Vfb. The feedback voltage Vfb is then coupled to the gates of the transistors M3, M4 via the transistors R1, R2, to control the currents I3, I4 being injected into the drains of the transistors M1, M2 through the transistors M3, M4. Since the amounts of the currents I3, I4 affect the currents I1, I2 passing through the switching circuit 104, the purpose of stabilizing the common-mode voltage level is so achieved. Generally, the resistance of the resistors R1, R2 is chosen relatively high to prevent the high frequency component of the feedback voltage Vfb outputted from the common-mode feedback circuit 106 from affecting the input voltage (Vip, Vin).

Figure 2:
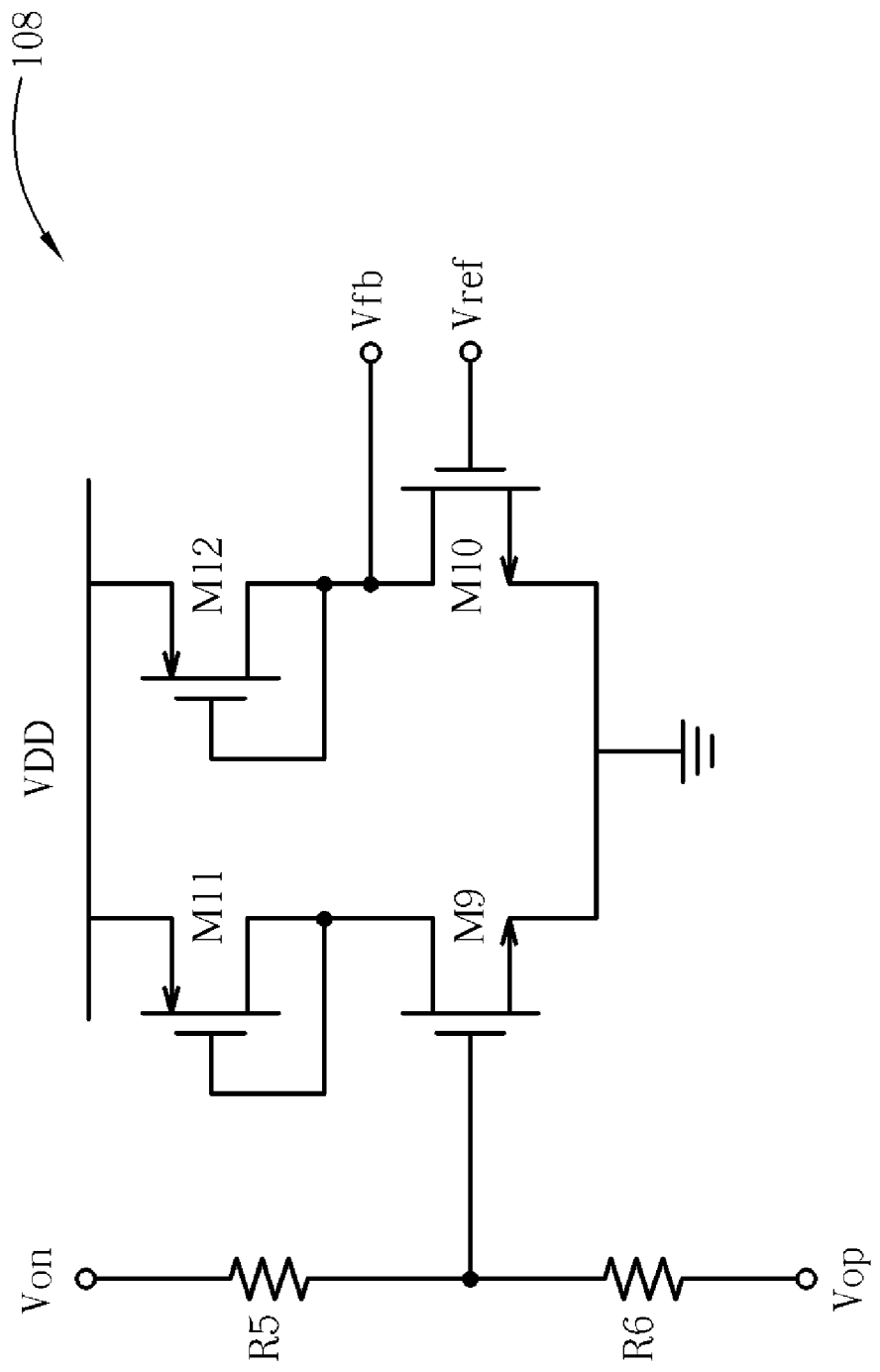
FIG. 2 is a schematic diagram illustrating a common-mode feedback circuit according to one embodiment of the present invention.
Figure 3:
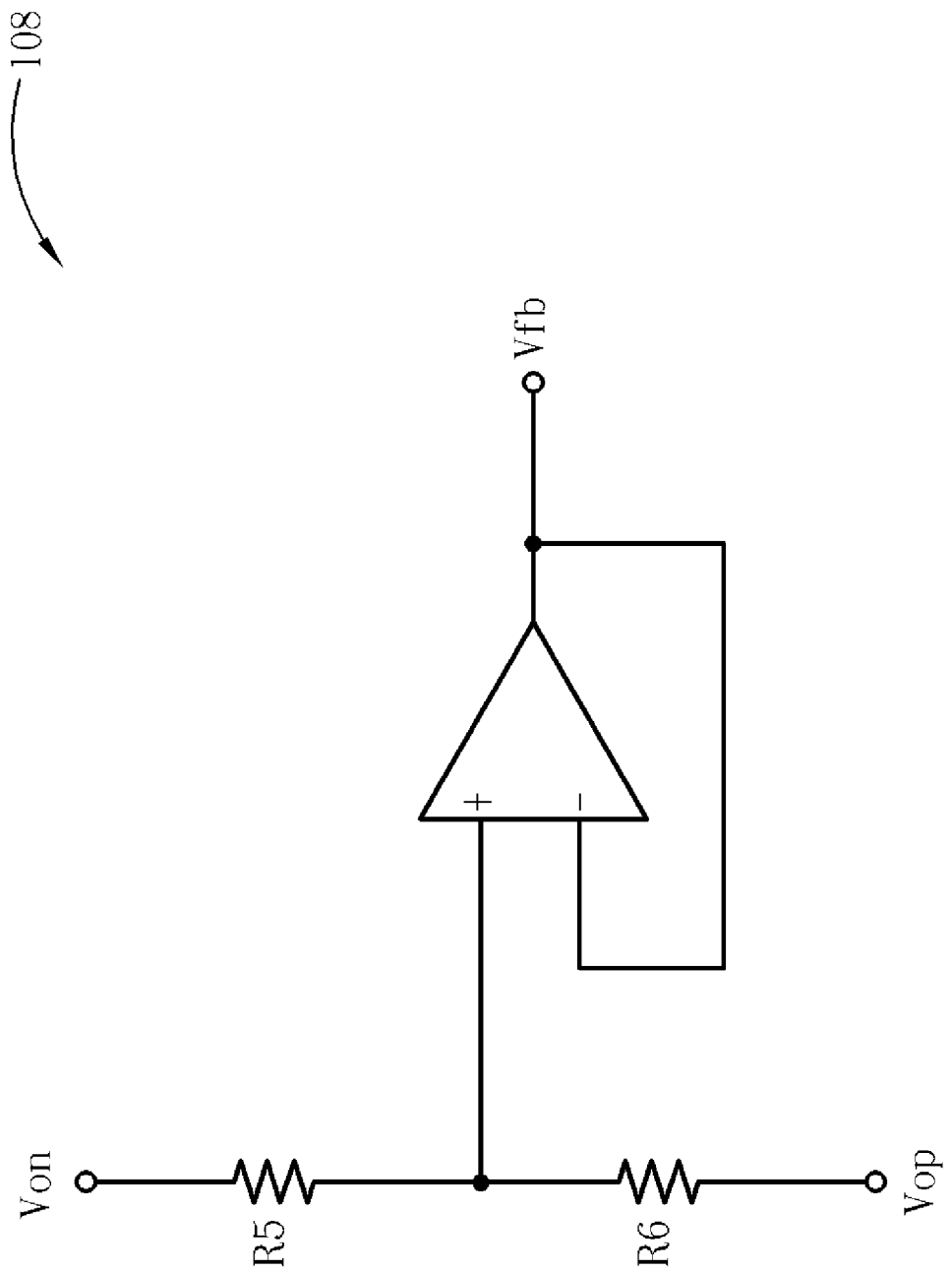
FIG. 3 is a schematic diagram illustrating a common-mode feedback circuit according to another embodiment of the present invention.

Please refer to FIG. 2. FIG. 2 is a schematic diagram illustrating a common-mode feedback circuit according an embodiment of the present invention. As shown in FIG. 2, the common-mode feedback circuit 108 includes a common-mode voltage acquisition device composed of resistors R5, R6. When the resistors R5 and R6 are set of the same resistance value, according to voltage division rule the voltage level at the coupling node between R5 and R6 becomes the average of the output signal (Vop, Von), i.e., the common-mode voltage. This common-mode voltage is coupled to an input terminal of an operational amplifier circuit composed of transistors M9, M10, M11, and M12. Additionally, another input terminal of the operational amplifier circuit receives the reference voltage Vref, and an output terminal of the operational amplifier circuit outputs the feedback voltage Vfb. With this structure, the common-mode feedback path can stabilize a common-mode voltage of the mixer output terminal within a fixed range by establishing a negative feedback mechanism. It is well known to those skilled in electronic circuit design that the circuit in FIG. 2 is equivalent to circuit configuration illustrating an operational amplifier structure with a negative feedback connection as shown in FIG. 3 and that any circuit design equivalent to that shown in FIG. 3 can achieve the same objective.

It should be noted that, in the above mentioned embodiment, the common-mode feedback path utilizes the output signal (Vop, Von) of the mixer to serve as its input signal, and utilizes the feedback signal Vfb to control the currents I3, I4 passing through transistors M3, M4 to thereby adjust currents I1, I2 passing through the switch circuit 104, and the common-mode feedback is so realized. Such a method of accomplishing common-mode feedback control "before" the switching circuit 104 performs the mixing operation exhibits particular advantages, especially for down-converting applications. For down-converting applications, the output signal (Vop, Von) usually has fairly low operating frequency, thus it is easily affected by the flicker noise, which has significant impact on low frequency signals. According to the embodiment of the present invention, the point of control for common-mode feedback is set before the mixing operation performed by the switching circuit 104. In other words, the output signal (Vop, Von) and the output terminal of the feedback path is separated using the switching circuit 104. Such structure can prevent the flicker noise generated by the common-mode feedback path from contaminating the output signal, because the noise effect most significant at low frequency is shifted to a higher frequency band through the mixing operation with the local signal LO at the switching circuit 104.

It should be further noted that, the above-mentioned embodiment utilize resistors R1, R2 to achieve the goal of signal blocking (for down-converting applications, RF blocking), and this is not meant to limit the scope of the present invention. People skilled in the art can choose to adopt other circuit devices or structures to obtain the same result. Additionally, although in the above-mentioned embodiments PMOS transistors M3, M4 are used to adjust the currents I1 and I2, however, those skilled in the art can also choose to use NMOS transistors or other circuit devices to adjust the common-mode feedback circuit 108, to obtain the same result. Therefore, said PMOS transistors M3, M4 adjusting the currents I1 and I2 are not meant to limit the present invention. These alternative designs fall in the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A mixer, comprising:
   a switching circuit, having a first pair of differential signal nodes and a second pair of differential signal nodes, for switching according to a local oscillation signal;
   an amplifying stage circuit, coupled to the first pair of differential signal nodes, for receiving an input signal and amplifying the input signal;
   a load circuit, coupled to the second pair of differential signal nodes, for serving as the loading of the mixer and generating an output signal of the mixer;
   a common-mode feedback circuit, for receiving the output signal and generating a feedback signal according to the output signal;
   a first current source, coupled to a first node of the first pair of differential signal nodes, for receiving the feedback signal and generating a first current according to the feedback signal; and
   a second current source, coupled to a second node of the first pair of differential signal nodes, for receiving the feedback signal and generating a second current according to the feedback signal.

2. The mixer of claim 1, wherein the switching circuit comprises:
   a first switch, coupled to the first node and a third node of the second pair of differential signal nodes;
   a second switch, coupled to the first node and a forth node of the second pair of differential signal nodes;
   a third switch, coupled between the second node and third node; and
   a forth switch, coupled between the second node and the forth node.

3. The mixer of claim 2, wherein the load circuit comprises:
   a third resistor, coupled to the third node; and
   a forth resistor, coupled to the forth node.

4. The mixer of claim 3, wherein the amplifying stage circuit comprises:
   a first NMOS transistor, coupled to the first node; and
   a second NMOS transistor, coupled to the second node.

5. The mixer of claim 1, wherein the first current source comprises a first PMOS transistor, the second current source comprises a second PMOS transistor, and the mixer further comprises:
   a first resistor, coupled between a gate of the first PMOS transistor and the common-mode feedback circuit, wherein the first current source receives the feedback signal via the first resistor; and
   a second resistor, coupled between a gate of the second PMOS transistor and the common-mode feedback circuit, wherein the second current source receives the feedback signal via the second resistor.

6. The mixer of claim 5, wherein the common-mode feedback circuit comprises:
   a common-mode voltage acquisition device, for receiving the output signal to generate a common-mode voltage signal; and
   an operational amplifier circuit, for receiving the common-mode voltage signal to generate the feedback signal.

7. A mixer, comprising:
   a switching circuit, having a first pair of differential signal nodes and a second pair of differential signal nodes, for switching according to a local oscillation signal;
   an amplifying stage circuit, coupled to the first pair of differential signal nodes, for receiving an input signal and amplifying the input signal;
   a load circuit, coupled to the second pair of differential signal nodes, for serving as the loading of the mixer and generating an output signal of the mixer; and
   a common-mode feedback path, for receiving the output signal, generating a feedback signal according to the output signal, and adjusting an amount of current passing through the switching circuit according to the feedback signal.

8. The mixer of claim 7, wherein the common-mode feedback path comprises:
   a first current source, coupled to a first node of the first pair of differential signal nodes, for generating a first current according to the feedback signal; and
   a second current source, coupled to a second node of the first pair of differential signal nodes, for generating a second current according to the feedback signal.

9. The mixer of claim 8, wherein the switching circuit comprises:
   a first switch, coupled to the first node and a third node of the second pair of differential signal nodes;

a second switch, coupled to the first node and a forth node of the second pair of differential signal nodes;
a third switch, coupled to the second node and third node; and
a forth switch, coupled to the second node and the forth node.

10. The mixer of claim 9, wherein the load circuit comprises:
a third resistor, coupled to the third node; and
a forth resistor, coupled to the forth node.

11. The mixer of claim 10, wherein the amplifying stage circuit comprises:
a first NMOS transistor, coupled to the first node; and
a second NMOS transistor, coupled to the second node.

12. The mixer of claim 11, wherein the first current source comprises a first PMOS transistor, and the second current source comprises a second PMOS transistor.

13. A mixer, comprising:
a switching circuit, having a first pair of differential signal nodes and a second pair of differential signal nodes, for switching according to a local oscillation signal;
an amplifying stage circuit, coupled to the first pair of differential signal nodes for receiving an input signal and amplifying the input signal;
a load circuit, coupled to the second pair of differential signal nodes, for serving as the loading of the mixer and generating an output signal of the mixer; and
a common-mode feedback path, coupled to the second pair of differential signal nodes for receiving the output signal from the second pair of differential signal nodes, and coupled to the first pair of differential signal nodes for adjusting a DC bias state of the first pair of differential signal nodes.

14. The mixer of claim 13, wherein the common-mode feedback path comprises:

a first current source, coupled to a first node of the first pair of differential signal nodes, for receiving the feedback signal and generating a first current according to the feedback signal; and
a second current source, coupled to a second node of the first pair of differential signal nodes, for receiving the feedback signal and generating a second current according to the feedback signal.

15. The mixer of claim 14, wherein the DC bias state of the first pair of differential signal nodes comprises an amount of current passing through the switching circuit and an amount of current passing through the first current source and the second current source.

16. The mixer of claim 14, wherein the switching circuit comprises:
a first switch, coupled to the first node and a third node of the second pair of differential signal nodes;
a second switch, coupled to the first node and a forth node of the second pair of differential signal nodes;
a third switch, coupled between the second node and third node; and
a forth switch, coupled between the second node and the forth node.

17. The mixer of claim 16, wherein the load circuit comprises:
a third resistor, coupled to the third node; and
a forth resistor, coupled to the forth node.

18. The mixer of claim 17, wherein the amplifying stage circuit comprises:
a first NMOS transistor, coupled to the first node; and
a second NMOS transistor, coupled to the second node.

19. The mixer of claim 18, wherein the first current source comprises a first PMOS transistor, and the second current source comprises a second PMOS transistor.

* * * * *